United States Patent [19]
Ito

[11] Patent Number: 6,137,177
[45] Date of Patent: Oct. 24, 2000

[54] CMOS SEMICONDUCTOR DEVICE

[75] Inventor: Hiroshi Ito, Tokyo, Japan

[73] Assignee: NEC Corporation, Tokyo, Japan

[21] Appl. No.: 09/181,328

[22] Filed: Oct. 28, 1998

[30] Foreign Application Priority Data

Oct. 31, 1997 [JP] Japan ................................. 9-300867

[51] Int. Cl.⁷ .......................... H01L 23/485; H01L 29/40
[52] U.S. Cl. .......................... 257/751; 257/756; 257/767; 257/410; 257/411; 257/413; 257/369
[58] Field of Search .................................. 257/410, 411, 257/412, 413, 751, 756, 767, 369

[56] References Cited

U.S. PATENT DOCUMENTS

| | | | |
|---|---|---|---|
| 4,897,368 | 1/1990 | Kobushi et al. | 438/592 |
| 4,935,804 | 6/1990 | Ito et al. | 257/476 |
| 5,021,848 | 6/1991 | Chiu | 257/317 |
| 5,023,679 | 6/1991 | Shibata | 257/344 |
| 5,053,849 | 10/1991 | Izawa et al. | 257/401 |
| 5,093,700 | 3/1992 | Sakata | 257/288 |
| 5,402,374 | 3/1995 | Tsuruta et al. | 365/185.06 |
| 5,744,845 | 4/1998 | Sayama et al. | 257/371 |
| 5,818,092 | 10/1998 | Bai et al. | 257/388 |

FOREIGN PATENT DOCUMENTS

| | | | |
|---|---|---|---|
| 0 682 359 A1 | 11/1995 | European Pat. Off. . | |
| 196 11 959 A1 | 3/1997 | Germany . | |
| 63-177538 | 7/1988 | Japan . | |
| 5-291567 | 11/1993 | Japan | H01L 29/784 |
| 6-104428 | 4/1994 | Japan | H01L 29/784 |
| 6-151834 | 5/1994 | Japan . | |
| 7-94731 | 4/1995 | Japan . | |
| 7-202011 | 8/1995 | Japan . | |
| 7-221097 | 8/1995 | Japan . | |
| 8-274090 | 10/1996 | Japan | H01L 21/318 |
| 9-8148 | 1/1997 | Japan | H01L 21/8238 |
| 9-50997 | 2/1997 | Japan . | |
| 9-64349 | 3/1997 | Japan | H01L 29/78 |
| 9-129870 | 5/1997 | Japan | H01L 29/78 |

OTHER PUBLICATIONS

Japanese Office Action (with translation) dated Dec. 22, 1999.

*Primary Examiner*—John Guay
*Attorney, Agent, or Firm*—Sughrue, Mion, Zinn, Macpeak & Seas, PLLC

[57] ABSTRACT

There is provided a method of fabricating a CMOS semiconductor device including nMOSFET and pMOSFET, including the steps of (a) forming a gate insulating film on a semiconductor substrate, (b) forming a first polysilicon film on the gate insulating film, (c) forming an interlayer insulating film on the first polysilicon film, (d) forming a second polysilicon film on the interlayer insulating film, (e) shaping the first polysilicon film, the interlayer insulating film, and the second polysilicon film into a gate electrode in both a first region where the nMOSFET is to be fabricated and a second region where the pMOSFET is to be fabricated, and (f) doping n-type impurities into the first region and p-type impurities into the second region by ion-implantation. The method makes it possible to prevent reduction in dielectric voltage of a gate insulating film, which would be caused by diffusion of titanium atoms, without causing a gate electrode to be depleted.

5 Claims, 4 Drawing Sheets

CMOS SEMICONDUCTOR DEVICE

BACKGROUND OF THE INVENTION

1. Field of the Invention

The invention relates to a CMOS semiconductor device including a gate electrode into which p-type impurities are heavily doped and a gate electrode into which n-type impurities are heavily doped, and further to a method of fabricating the same. More particularly, the invention relates to a CMOS semiconductor device capable of suppressing reduction in a dielectric voltage of a gate insulating film.

2. Description of the Related Art

In these days, a gate electrode has been designed to having a smaller width as LSI has been more highly integrated. A smaller width causes a gate electrode to have a higher resistance. As a solution to such a higher resistance of a gate electrode, a gate electrode has been conventionally composed of a polycide wiring layer comprised of a polysilicon layer and a silicide layer. As a silicide layer has been used a tungsten silicide layer having resistivity of about 70 $\mu\Omega$-cm.

As LSI has been required to fabricate in a smaller size, a gate electrode has been required to have a smaller width, and in addition, the tungsten silicide layer has been required to have a smaller thickness. As a result, a resistance of the polycide wiring layer has increased in inverse proportion to the second power of a scale-down ratio of the polycide wiring layer. For this reason, a titanium silicide layer is presently used in place of a tungsten silicide layer, because a titanium silicide layer has smaller resistivity than that of a tungsten silicide layer. A titanium silicide layer has resistivity of about 15 $\mu\Omega$-cm, and is generally formed by means of salicide process. In salicide process, both a gate electrode and source/drain diffusion layers are concurrently silicided. The salicide process is now widely used, in particular, for fabricating a semiconductor device having a gate length of 0.25 $\mu$m or smaller.

A conventional pMOSFET has been fabricated as a transistor having a buried channel. However, if such a conventional pMOSFET was formed as having a gate length of 0.25 $\mu$m or smaller, there occurred significant short channel effect. For this reason, pMOSFET is predominantly formed as a transistor having a channel at a surface rather than a transistor having a buried channel. That is, an n-n gate type, which has been predominantly used, is substituted by a p-n gate type in CMOS semiconductor device.

Hereinbelow is explained a conventional method of fabricating CMOS semiconductor device including a p-n type gate by means of titanium salicide process. FIGS. 1A to 1E are cross-sectional views of CMOS semiconductor device, illustrating respective steps of a conventional method of fabricating the same.

First, as illustrated in FIG. 1A, field oxide films 102 are formed at a surface of a p-type silicon substrate 101 in selected regions. Then, p-well 103 is formed in the silicon substrate 101 in a region where nMOSFET is to be fabricated, and n-well 104 is formed in the silicon substrate 101 in a region where pMOSFET is to be fabricated. Then, the p-well 103 and n-well 104 are both covered at a surface thereof with a gate oxide film 105.

Then, as illustrated in FIG. 1B, a polysilicon layer having a shape of a gate electrode is formed on the gate oxide film 105. Thereafter, a portion of the gate oxide film 105 which is not covered with the polysilicon layer is removed. Then, n-type ions are implanted into a region where nMOSFET is to be fabricated, and p-type ions are implanted into a region where pMOSFET is to be fabricated, to thereby form diffusion layers in both the regions.

Then, a sidewall 113 is formed on a side surface of the polysilicon layer. Thereafter, n-type ions are implanted into the region where nMOSFET is to be fabricated, by means of photolithography, at a higher concentration than a concentration at which n-type ions have been previously implanted to the region, to thereby form source/drain n$^+$ layers 114. Similarly, p-type ions are implanted into the region where pMOSFET is to be fabricated, by means of photolithography, at a higher concentration than a concentration at which p-type ions have been previously implanted to the region, to thereby form source/drain p$^+$ layers 115. At the same time, LDDn layer 111 having a lower impurity concentration than that of the source/drain n$^+$ layers 114 is also formed below the sidewall 113 and adjacent to the source/drain n$^+$ layers 114, and LDDp layer 112 having a lower impurity concentration than that of the source/drain p$^+$ layers 115 is also formed below the sidewall 113 and adjacent to the source/drain p$^+$ layers 115.

By the above-mentioned second ion-implantation, n-type ions are implanted into the polysilicon layer in the region where nMOSFET is to be fabricated, with the result that an n$^+$ gate electrode 116 is formed above the p-well 103, and p-type ions are implanted into the polysilicon layer in the region where pMOSFET is to be fabricated, with the result that a p$^+$ gate electrode 117 is formed above the n-well 104.

Then, as illustrated in FIG. 1C, a titanium layer 118 is deposited all over the product by sputtering, for instance.

Then, as illustrated in FIG. 1D, the product is thermally annealed, for instance, at about 700 degrees centigrade in a nitrogen atmosphere, to thereby cause the titanium layer 118 to react with the n$^+$ gate electrode 116, the p$^+$ gate electrode 117, the source/drain n$^+$ layer 114, and the source/drain p$^+$ layer 115. As a result, an n$^+$ titanium silicide layer 116a is formed in an upper part of the n$^+$ gate electrode 116, a p$^+$ titanium silicide layer 117a is formed in an upper part of the p$^+$ gate electrode 117, a source/drain n$^+$ titanium silicide layer 114a is formed on the source/drain n$^+$ layer 114, and a source/drain p$^+$ titanium silicide layer 115a is formed on the source/drain p$^+$ layer 115.

After non-reacted portions of the titanium layer 118 are removed, the product is thermally annealed at 850 degrees centigrade, for instance, in a nitrogen atmosphere to thereby reduce resistances of the n$^+$ titanium silicide layer 116a, the p$^+$ titanium silicide layer 117a, the source/drain n$^+$ titanium silicide layer 114a, and the source/drain p$^+$ titanium silicide layer 115a. Thus, there is completed CMOS semiconductor device, as illustrated in FIG. 1E.

In the thus fabricated CMOS semiconductor device, when the titanium silicide layers 116a, 117a, 114a, and 115a are thermally annealed for reducing a resistance thereof, titanium atoms diffuse in the gate electrodes 116 and 117, and reach the gate oxide film 105, resulting in a problem of reduction in dielectric voltage of the gate oxide film 105.

In order to solve this problem, Japanese Unexamined Patent Publication No. 63-177538 having been published on Jul. 21, 1988 has suggested a semiconductor device capable of preventing reduction in dielectric voltage of a gate oxide film. FIG. 2 is a cross-sectional view of a semiconductor device suggested in the Publication.

The suggested semiconductor device includes field oxide films 202 formed on a p-type silicon substrate 201 in selected regions, and a gate oxide film 205 formed between the field oxide films 202. A polysilicon film 203 is formed on both the field oxide film 202 and the gate oxide film 205. A silicon nitride film 204 is formed over the polysilicon layer 203. As illustrated in FIG. 2, the silicon nitride film 204 is formed above the field oxide films 202 with openings. A titanium silicide layer 210 is formed as a top layer entirely covering a product therewith. The titanium silicide layer 210 is in electrical connection with the polysilicon layer 203 through the openings of the silicon nitride film 204.

In accordance with the semiconductor device having the above-mentioned structure, since the silicon nitride film 204 is formed between the polysilicon layer 203 of which a gate electrode is formed, and the titanium silicide layer 210, it is possible to prevent titanium atoms contained in the titanium silicide layer 210 from reaching the gate oxide film 205.

However, there is a problem that it is not practical to apply the above-mentioned semiconductor device illustrated in FIG. 2 to a CMOS semiconductor device having a p-n type gate. As mentioned earlier, in a conventional process of fabricating a CMOS semiconductor device having a p-n type gate, ion-implantation and thermal annealing are applied to the polysilicon layer from which a gate electrode is formed, simultaneously with the formation of source/drain regions, in order to provide electrical conductivity to the polysilicon layer.

However, since the silicon nitride film 204 prevents diffusion of impurities into the polysilicon layer 203, a sufficient amount of impurities cannot be supplied to an interface between the polysilicon layer 203 and the gate oxide film 205, resulting in a gate electrode that is significantly depleted. This causes reduction in on-current.

Japanese Unexamined Patent Publication No. 7-94731 having been published on Apr. 7, 1995 has suggested a semiconductor device including a semiconductor substrate, a gate insulating film formed on the semiconductor substrate, and a gate electrode formed on the gate insulating film and comprised of a polysilicon layer, a barrier layer, and a refractory metal layer. The refractory metal film is covered at an upper surface and/or a side surface thereof with a refractory silicide layer, and is further covered at the upper surface and/or the side surface with a silicon nitride film with the above-mentioned refractory silicide layer being sandwiched between the refractory metal film and the silicon nitride film.

Japanese Unexamined Patent Publication No. 7-221097 having been published on Aug. 18, 1995 has suggested a semiconductor device including a silicon substrate, a gate oxide film formed on the silicon substrate, an amorphous silicon film formed on the gate oxide film by chemical vapor deposition (CVD), and a titanium silicide film formed on the amorphous silicon film by sputtering. By implanting oxygen ions into the amorphous silicon film, SiOx film is formed in the amorphous silicon film, followed by thermal annealing to thereby change the amorphous silicon film into a polysilicon film.

SUMMARY OF THE INVENTION

In view of the above-mentioned problems in the conventional CMOS semiconductor devices, it is an object of the present invention to provide a CMOS semiconductor device which is capable of preventing reduction in dielectric voltage of a gate insulating film, which would be caused by diffusion of titanium atoms, without causing a gate electrode to be depleted.

It is also an object of the present invention to provide a method of fabricating such a CMOS semiconductor device.

In one aspect of the present invention, there is provided a CMOS semiconductor device including (a) a semiconductor substrate, (b) a gate insulating film formed on the semiconductor substrate, and (c) a gate electrode formed on the gate insulating film, and including, (c-1) a first electrically conductive film formed on the gate insulating film, (c-2) an interlayer insulating film formed on the first electrically conductive film, and (c-3) a second electrically conductive film formed on the interlayer insulating film.

For instance, the first and second electrically conductive films may be composed of polysilicon. For instance, the interlayer insulating film may be composed of silicon oxide and/or silicon nitride.

In accordance with the above-mentioned CMOS semiconductor device, since the interlayer insulating film is formed between the first and second electrically conductive films, if a refractory metal silicide layer such as a titanium silicide layer is to be formed on the second electrically conductive film, it is possible to allow diffusion of atoms of refractory metal into an interface between the first electrically conductive film and the gate insulating film, but prevent diffusion of the atoms into the gate insulating film. Accordingly, it is possible to prevent the gate electrode from being depleted, and further prevent reduction in dielectric voltage of the gate insulating film.

It is preferable that the second electrically conductive film has a smaller thickness than a thickness of the first electrically conductive film.

By designing the second electrically conductive film to have a smaller thickness than a thickness of the first electrically conductive film, it is possible to further prevent refractory metal atoms from diffusing into a gate electrode.

For instance, the interlayer insulating film may have a thickness of about 1 nm.

In another aspect of the present invention, there is provided a method of fabricating a CMOS semiconductor device including nMOSFET and pMOSFET, including the steps of (a) forming a gate insulating film on a semiconductor substrate, (b) forming a first electrically conductive film on the gate insulating film, (c) forming an interlayer insulating film on the first electrically conductive film, (d) forming a second electrically conductive film on the interlayer insulating film, (e) shaping the first electrically conductive film, the interlayer insulating film, and the second electrically conductive film into a gate electrode in both a first region where the nMOSFET is to be fabricated and a second region where the pMOSFET is to be fabricated, and (f) doping n-type impurities into the first region and p-type impurities into the second region.

It is preferable that the first electrically conductive film is formed in a film-forming furnace in the step (b), and that the step (c) includes the steps of (c-1) forming an oxide film on the first electrically conductive film by taking the semiconductor substrate out of the film-forming furnace, and (c-2) thermally annealing the oxide film in ammonia atmosphere.

It is preferable that the oxide film is thermally annealed at a temperature in the range of 600 to 1000 degrees centigrade both inclusive for 10 seconds to 60 minutes in the step (c-2).

It is preferable that the steps (b), (c), and (d) are carried out in a common film-forming furnace, in which case, the step (c) preferably includes (c-3) forming an oxide film on the first electrically conductive film by rendering the film-forming furnace in an oxidation atmosphere, and (c-4) nitrifying an interface between the first electrically conductive film and the oxide film by rendering the film-forming furnace in an ammonia atmosphere.

The above and other objects and advantageous features of the present invention will be made apparent from the following description made with reference to the accompanying drawings, in which like-reference characters designate the same or similar parts throughout the drawings.

DESCRIPTION OF THE PREFERRED EMBODIMENTS

Hereinbelow is explained a method of fabricating a CMOS semiconductor device, in accordance with the first embodiment, with reference to FIGS. 3A to 3I.

Figure 1A:
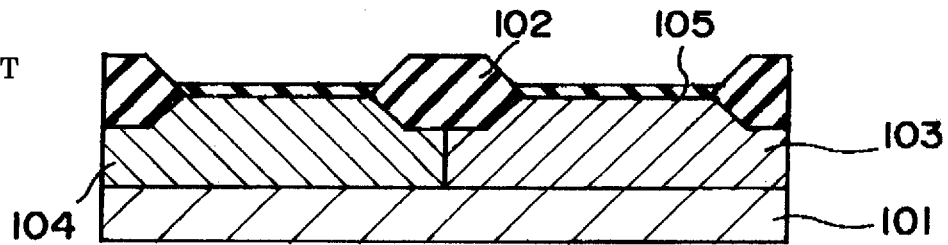
FIGS. 1A to 1E are cross-sectional views of a CMOS semiconductor device, illustrating respective steps of a conventional method of fabricating the same.
Figure 1B:
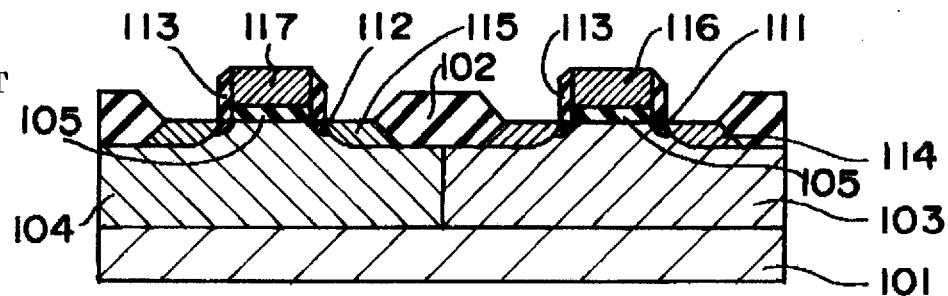
Figure 1C:
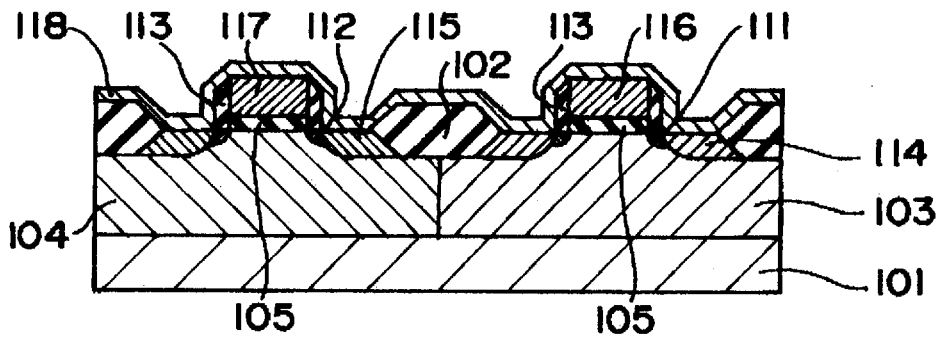
Figure 1D:
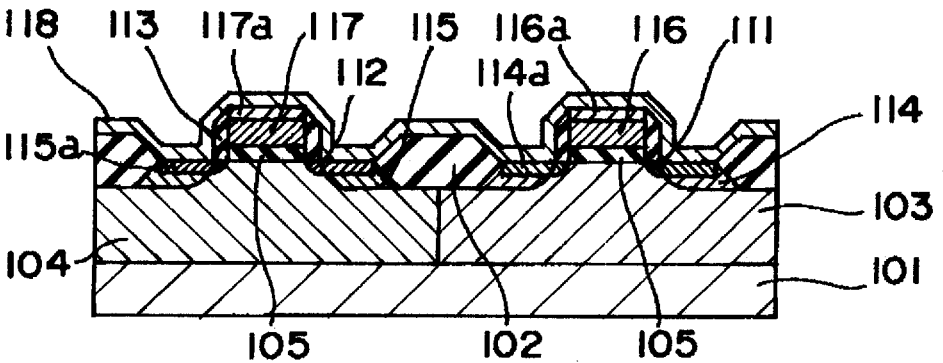
Figure 1E:
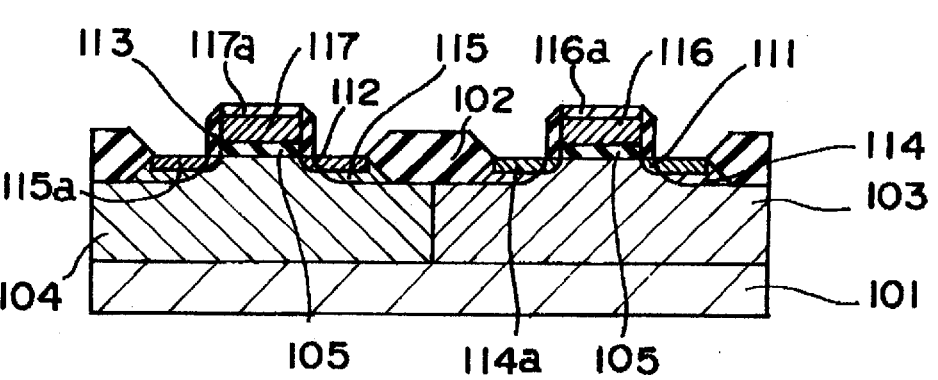
Figure 2:
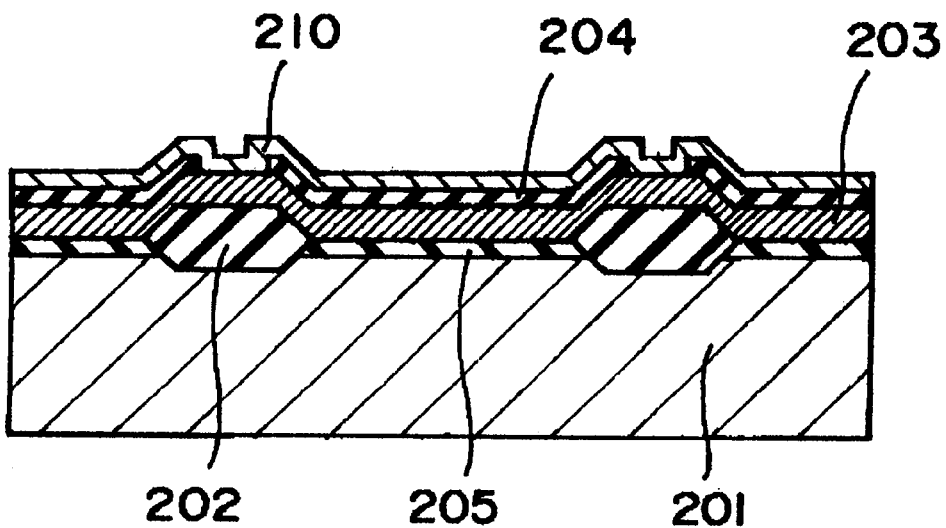
FIG. 2 is a cross-sectional view of another conventional CMOS semiconductor device.
Figure 3A:
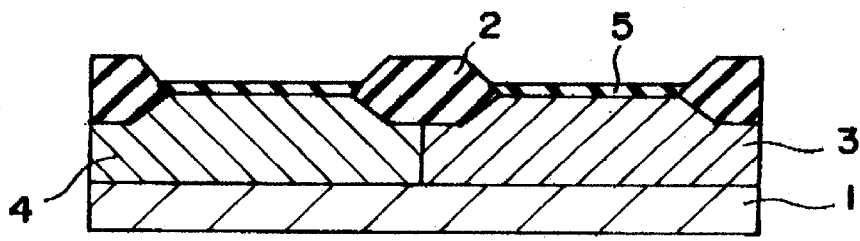
FIGS. 3A to 3I are cross-sectional views of a CMOS semiconductor device in accordance with the first embodiment of the present invention, illustrating respective steps of a method of fabricating the same.

First, as illustrated in FIG. 3A, field oxide films 2 are formed at a surface of a p-type silicon substrate 1 in selected regions. Then, p-well 3 is formed in the silicon substrate 1 in a region where nMOSFET is to be fabricated, and n-well 4 is formed in the silicon substrate 1 in a region where pMOSFET is to be fabricated. Then, the p-well 3 and n-well 4 are both covered at a surface thereof with a gate oxide film 5 having a thickness in the range of 5 nm to 6 nm both inclusive.

Figure 3B:
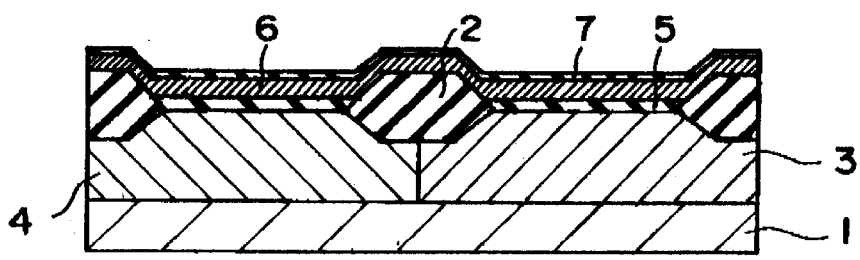

Then, as illustrated in FIG. 3B, a first polysilicon film 6 as the first electrically conductive film is formed on the gate oxide film 5 in a film-forming furnace by low pressure chemical vapor deposition (LPCVD). Then, the p-type silicon substrate 1 is taken out of the film-forming furnace. As a result, a natural oxidation film having a thickness of about 1 nm is formed as an interlayer insulating film 7 at a surface of the first polysilicon film 6.

Figure 3C:
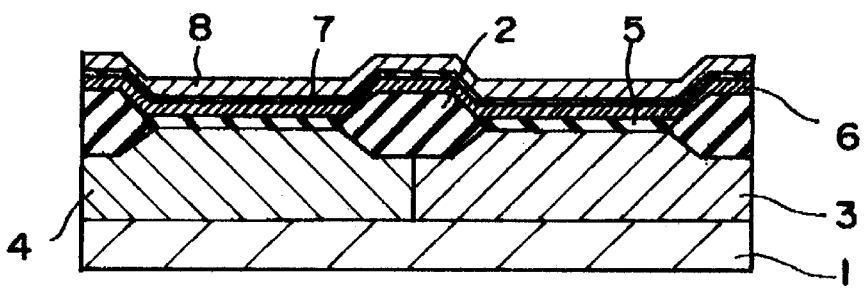

Then, as illustrated in FIG. 3C, a second polysilicon film 8 as the second electrically conductive film is formed on the interlayer insulating film 7.

Figure 3D:
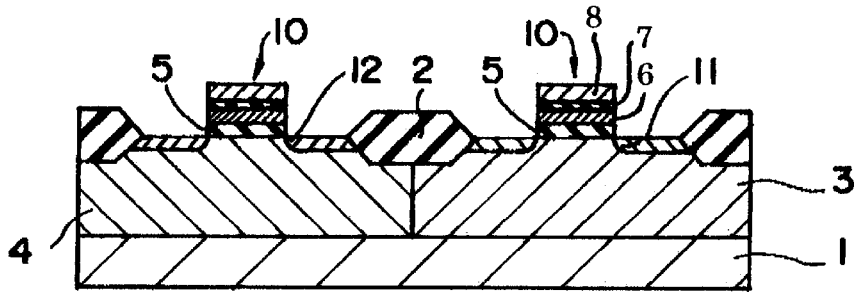

Then, as illustrated in FIG. 3D, the first polysilicon film 6, the interlayer insulating film 7, and the second polysilicon film 8 are patterned into a multi-layered silicon layer 10 having a shape of a gate electrode. The gate oxide film 5 is removed except a portion on which the multi-layered silicon layer 10 is formed. Thereafter, n-type ions are doped by ion-implantation into a region where nMOSFET is to be fabricated, to thereby form n-type diffusion layers 11. Similarly, p-type ions are doped by ion-implantation into a region where pMOSFET is to be fabricated, to thereby form p-type diffusion layers 12.

Figure 3E:
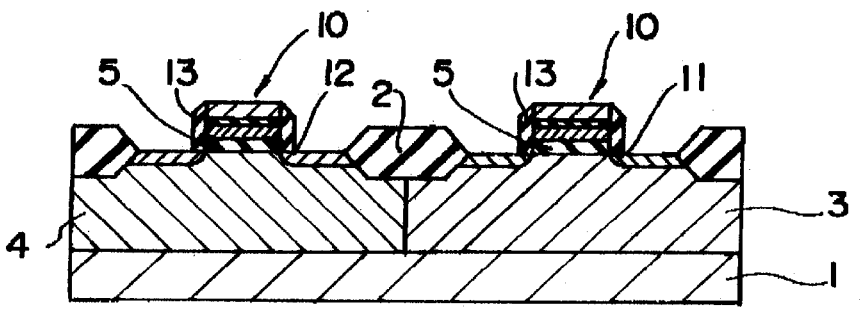

Then, as illustrated in FIG. 3E, a sidewall 13 is formed on a side surface of the multi-layered silicon layer 10.

Figure 3F:
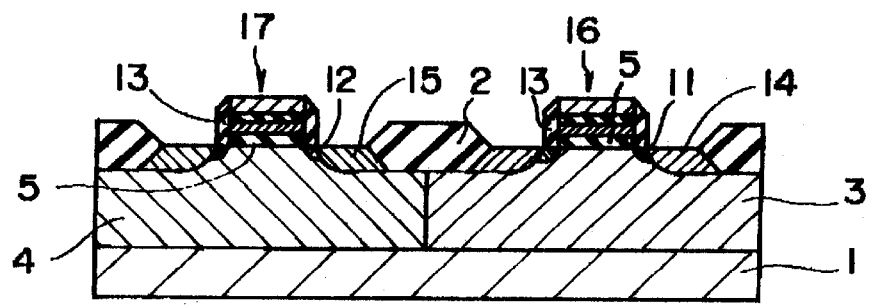

Then, as illustrated in FIG. 3F, arsenic (As) is doped by ion-implantation into the region where nMOSFET is to be fabricated, at a higher concentration than a concentration at which impurities have been previously doped into the same region. Similarly, $BF_2$ is doped by ion-implantation into the region where pMOSFET is to be fabricated, at a higher concentration than a concentration at which impurities have been previously doped into the same region. Thereafter, the doped As and $BF_2$ are activated. As a result, a source/drain $n^+$ layer 14 heavily including n-type impurities is formed at a surface of the p-well 3, and a source/drain $p^+$ layer 15 heavily including p-type impurities is formed at a surface of the n-well 4.

The n-type diffusion layer 11 having a smaller impurity concentration than that of the source/drain $n^+$ layer 14 is partially kept as it is below the sidewall 13 and adjacent to the source/drain $n^+$ layer 14. Similarly, the p-type diffusion layer 12 having a smaller impurity concentration than that of the source/drain $p^+$ layer 15 is partially kept as it is below the sidewall 13 and adjacent to the source/drain $p^+$ layer 15. Thus, there are formed source/drain regions having a lightly doped drain (LDD) structure.

The multi-layered silicon layer 10 in the region where nMOSFET is to be fabricated is turned into a $n^+$ silicon layer 16 to which n-type impurity is heavily doped, and the multi-layered silicon layer 10 in the region where pMOSFET is to be fabricated is turned into a $p^+$ silicon layer 17 to which p-type impurity is heavily doped. Since the interlayer insulating film 7 has a thickness of about 1 nm, the doped impurities can readily pass through the interlayer insulating film 7, and reach an interface between the first polysilicon film 6 and the gate oxide film 5.

Figure 3G:
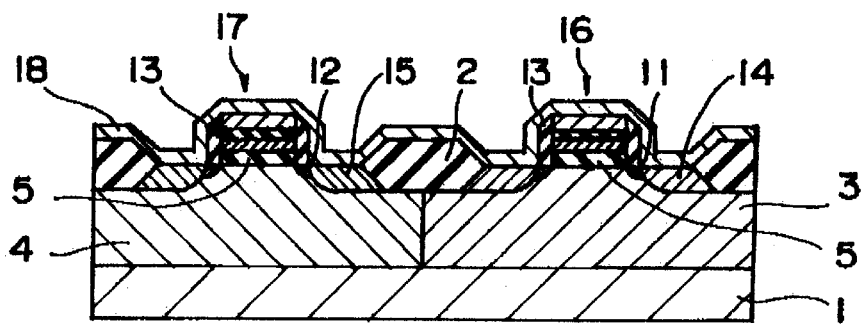

Then, as illustrated in FIG. 3G, a titanium layer 18 is deposited all over the product by sputtering.

Figure 3H:
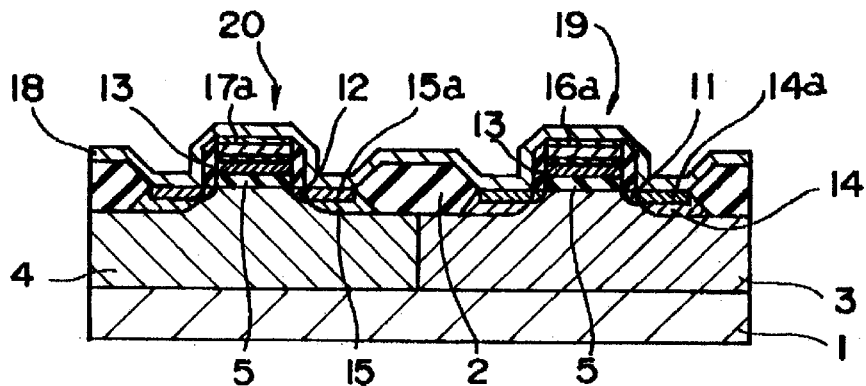

Then, as illustrated in FIG. 3H, the product is thermally annealed at about 650–700 degrees centigrade for 10 to 60 seconds in a nitrogen atmosphere. The titanium layer 18 reacts with the $n^+$ silicon layer 16, and as a result, a $n^+$ titanium silicide layer 16a is formed in an upper part of the $n^+$ silicon layer 16. Thus, there is formed a $n^+$ gate electrode 19 comprised of the $n^+$ silicon layer 16 and the $n^+$ titanium silicide layer 16a. Similarly, the titanium layer 18 reacts with the $p^+$ silicon layer 17, and as a result, a $p^+$ titanium silicide layer 17a is formed in an upper part of the $p^+$ silicon layer 17. Thus, there is formed a $p^+$ gate electrode 20 comprised of the $p^+$ silicon layer 17 and the $p^+$ titanium silicide layer 17a. In addition, the titanium layer 18 reacts with the source/drain $n^+$ layer 14, and the source/drain $p^+$ layer 15. As a result, a source/drain $n^+$ titanium silicide layer 14a is formed in an upper part of the source/drain $n^+$ layer 14, and a source/drain $p^+$ titanium silicide layer 15a is formed in an upper part of the source/drain $p^+$ layer 15.

Figure 3I:
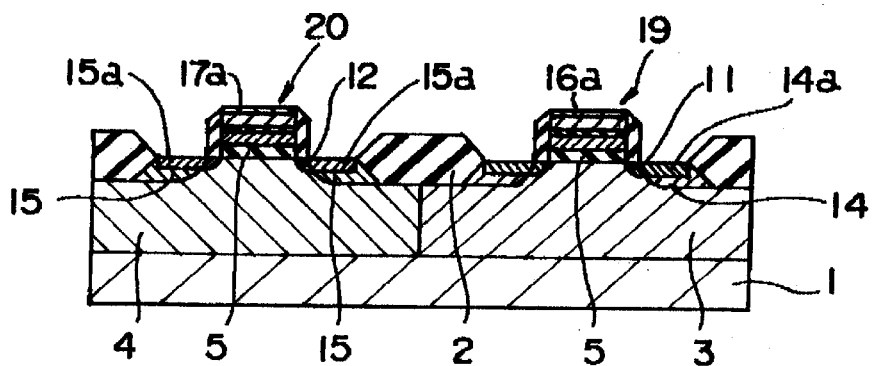

Then, as illustrated in FIG. 3I, non-reacted portions of the titanium layer 18 and titanium nitride having been produced as a result of the above-mentioned thermal annealing are removed by wet-etching.

Then, the product is thermally annealed at 800–850 degrees centigrade for 10–60 seconds in a nitrogen atmosphere to thereby render the $n^+$ gate electrode 19, the $p^+$ gate electrode 20, the source/drain $n^+$ titanium silicide layer 14a, and the source/drain $p^+$ titanium silicide layer 15 a low-resistive.

In such a manner as mentioned above, the titanium silicide layers are formed in self-aligning fashion. Thereafter, a semiconductor device is completed in a conventional manner.

In accordance with the above-mentioned first embodiment, the interlayer insulating film 7 having a thickness of about 1 nm is sandwiched between the first and second polysilicon films 6 and 8. Hence, even though titanium atoms diffuse to an interface between the first polysilicon film 6 and the gate oxide film 5 from the $n^+$ and $p^+$ titanium silicide layers 16a and 17a, such titanium atoms are prevented from entering the gate oxide film 5. Accordingly, it is possible to suppress deterioration of the gate oxide film without the gate electrode being got depleted. Thus, a semiconductor device having the thus formed gate electrode would have high reliability.

After the formation of the interlayer insulating film 7, an interface between the interlayer insulating film 7 and the first polysilicon film 6 may be nitrified by thermally annealing the product at 600–1000 degrees centigrade for 10 seconds to 60 minutes in ammonia (NH$_3$) atmosphere. The nitrification of the interface efficiently suppresses diffusion of titanium atoms into the gate oxide film 5.

The thus fabricated CMOS semiconductor device in accordance with the first embodiment has such a structure as illustrated in FIG. 3I. The gate electrode 19 is comprised of the first polysilicon film 6, the interlayer insulating film 7 formed on the first polysilicon film 6 and having a thickness of about 1 nm, the second polysilicon film 8 formed on the interlayer insulating film 7, and the titanium silicide layer 16a formed on the second polysilicon film 8. The gate electrode 20 is comprised of the first polysilicon film 6, the interlayer insulating film 7 formed on the first polysilicon film 6 and having a thickness of about 1 nm, the second polysilicon film 8 formed on the interlayer insulating film 7, and the titanium silicide layer 17a formed on the second polysilicon film 8.

In accordance with the above-mentioned CMOS semiconductor device, the interlayer insulating film 7 is sandwiched between the first and second polysilicon films 6 and 8. Hence, titanium atoms contained in the titanium silicide layers 16a and 17a are prevented from entering the gate oxide film 5. Accordingly, it is possible to suppress deterioration of the gate oxide film 5.

In addition, since the interlayer insulating film 7 is quite thin, specifically, about 1 nm-thick, titanium atoms in the titanium silicide layers 16a and 17a could readily pass through the interlayer insulating film 7, and reach an interface between the first polysilicon film 6 and the gate oxide film 5. Hence, it is possible to prevent the gate electrode from getting depleted.

Hereinbelow is explained a method of fabricating a CMOS semiconductor device, in accordance with the second embodiment.

In the second embodiment, the field oxide films 2, the gate oxide film 5, and the first polysilicon film 6 are formed on the p-type silicon substrate 1, similarly to the first embodiment. Then, there is generated an oxidation atmosphere in the film-forming furnace without taking the silicon substrate 1 out of the film-forming furnace. As a result, a natural oxidation film having a thickness of about 1 nm is formed on the first polysilicon film 6.

Then, the film-forming furnace is changed into an ammonia atmosphere to thereby nitrify an interface between the first polysilicon film 6 and the natural oxidation film. As a result, there is formed the interlayer insulating film 7 composed of a silicon oxide film and a silicon nitride film.

Thereafter, the subsequent steps identical with the steps of the first embodiment are carried out to thereby complete a semiconductor device.

In accordance with the second embodiment, since an interface between the first polysilicon film and the natural oxidation film is nitrified, it would be possible to further prevent titanium atoms from diffusing into the gate oxide film.

If the interlayer insulating film 7 is located in an upper half in the n$^+$ gate electrode 19 and the p$^+$ gate electrode 20 in a thickness-wise direction of them, that is, if the second polysilicon film has a smaller thickness than a thickness of the first polysilicon film, it is possible to still further prevent titanium atoms from diffusing into the gate oxide film.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-300867 filed on Oct. 31, 1997 including specification, claims, drawings and summary is incorporated herein by reference in its entirety.

What is claimed is:

1. A CMOS semiconductor device comprising:

(a) a semiconductor substrate;

(b) a gate insulating film formed on said semiconductor substrate; and (c) a gate electrode formed on said gate insulating film, and including:

(c-1) a first electrically conductive film formed on said gate insulating film;

(c-2) an interlayer insulating film formed on said first electrically conductive film and composed of silicon oxide and silicon nitride; and (c-3) a second electrically conductive film formed on said interlayer insulating film.

2. The CMOS semiconductor device as set forth in claim 1, wherein said first electrically conductive film is composed of polysilicon.

3. The CMOS semiconductor device as set forth in claim 1, wherein said second electrically conductive film is composed of polysilicon.

4. The CMOS semiconductor device as set forth in claim 1, wherein said second electrically conductive film has a smaller thickness than a thickness of said first electrically conductive film.

5. A semiconductor device comprising:

(a) a semiconductor substrate;

(b) a gate insulating film formed on said semiconductor substrate; and (c) a gate electrode formed on said gate insulating film, and including:

(c-1) a first electrically conductive film formed on said gate insulating film;

(c-2) an interlayer insulating film formed on said first electrically conductive film and composed of silicon oxide and silicon nitride; and (c-3) a second electrically conductive film formed on said interlayer insulating film, wherein said interlayer insulating film has a thickness of about 1 nm.

* * * * *